United States Patent
Chen et al.

(10) Patent No.: US 11,970,342 B2
(45) Date of Patent: Apr. 30, 2024

(54) CHIP TRAY POSITIONING DEVICE

(71) Applicant: CHROMA ATE INC., Taoyuan (TW)

(72) Inventors: Chien-Ming Chen, Taoyuan (TW); Jui-Hsiung Chen, Taoyuan (TW); Chi-Wei Wang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 64 days.

(21) Appl. No.: 17/930,082

(22) Filed: Sep. 7, 2022

(65) Prior Publication Data

US 2023/0089716 A1 Mar. 23, 2023

Related U.S. Application Data

(60) Provisional application No. 63/245,231, filed on Sep. 17, 2021.

(51) Int. Cl.
| | |
|---|---|
| *B65G 47/90* | (2006.01) |
| *G01N 3/04* | (2006.01) |
| *G01N 3/06* | (2006.01) |
| *G01N 3/12* | (2006.01) |
| *G01R 31/28* | (2006.01) |
| *H01L 21/673* | (2006.01) |
| *H05K 13/04* | (2006.01) |

(52) U.S. Cl.
CPC ............ *B65G 47/905* (2013.01); *G01N 3/04* (2013.01); *G01N 3/06* (2013.01); *G01N 3/12* (2013.01); *G01R 31/2867* (2013.01); *G01R 31/2874* (2013.01); *G01R 31/2887* (2013.01); *G01R 31/2893* (2013.01); *H01L 21/67333* (2013.01); *H05K 13/0408* (2013.01); *G01N 2203/0044* (2013.01); *G01N 2203/0411* (2013.01)

(58) Field of Classification Search
CPC .......... H05K 13/0408; H01L 21/67333; B65G 47/905; G01N 3/04; G01N 3/06; G01N 3/12; G01R 31/2867; G01R 31/2874; G01R 31/2887; G01R 31/2893
See application file for complete search history.

(56) References Cited

U.S. PATENT DOCUMENTS

| 2017/0034968 A1* | 2/2017 | Yokoyama | ......... H05K 13/0413 |
| 2021/0018560 A1* | 1/2021 | Tsai | .................... G01R 31/2875 |

(Continued)

FOREIGN PATENT DOCUMENTS

| CN | 110035963 | * | 7/2019 | ......... B65G 47/1421 |

*Primary Examiner* — James R Bidwell
(74) *Attorney, Agent, or Firm* — McClure, Qualey & Rodack, LLP

(57) ABSTRACT

The present invention relates to a chip tray positioning device, which mainly comprises a frame body, a tray conveying module, a pulling module, a pushing module and a controller. The tray conveying module is disposed on the frame body, electrically connected to the controller and controlled to convey a chip tray from the start area to the end area. The pulling module and the pushing module are disposed on the frame body, electrically connected to the controller and controlled to cause the chip tray to be abutted against the end wall and the lateral wall of the frame body, thereby realizing the positioning of the chip tray and eliminating an error formed in the transfer process of the chip tray. In addition, the controller also controls the pushing module to knock the chip tray at a specific frequency so that the chip tray is vibrated.

10 Claims, 3 Drawing Sheets

(56) References Cited

U.S. PATENT DOCUMENTS

| | | | |
|---|---|---|---|
| 2023/0010092 A1* | 1/2023 | Kobayashi | G01N 3/20 |
| 2023/0086266 A1* | 3/2023 | Ouyang | G01R 31/2887 |
| | | | 324/757.01 |

* cited by examiner

CHIP TRAY POSITIONING DEVICE

BACKGROUND OF THE INVENTION

Field of the Invention

The present invention relates to a chip tray positioning device, in particular to a device for conveying a chip tray in an electronic device testing apparatus.

Description of the Related Art

Reference is made to FIG. 1, which is a plan view illustrating a module layout of a conventional electronic device testing apparatus. As shown in the figure, the conventional electronic device testing apparatus mainly includes a feeding device 11, a feeding shuttle 12, a testing device 13, a discharging shuttle 14 and a discharging device 16. The feeding device 11 is mainly used for transferring a chip tray 17, on which a plurality of electronic devices under test are carried, into a housing of the electronic device testing apparatus. After the electronic devices under test are transferred to the feeding shuttle 12 by means of a feeding pick-and-place device 15, the feeding shuttle 12 moves the electronic devices under test into the testing device 13 for testing. When the test is completed, the discharging shuttle 14 moves the tested electronic devices out of the testing device 13, and then, the tested electronic devices are moved to a chip tray 17 on the discharging device 16 by means of a discharging pick-and-place device 18. Finally, after the chip tray 17 on the discharging device 16 is fully loaded with the electronic devices, the discharging device 16 transfers the chip tray 17 out of the housing of the electronic device testing apparatus.

However, each of the conventional feeding device 11 and the conventional discharging device 16 is mostly in the form of a conveyor belt, so it is difficult to precisely position the chip tray 17, and positional deviation inevitably occurs. Either of the pick-and-place position or the pick-and-place height of the electronic device has to be precisely positioned. Otherwise, a failure in picking and placing the electronic device or an incorrect pick-and-place orientation may occur, and at worst, damage to the electronic device or failure of the apparatus may occur.

Taiwanese Invention Patent No. I274722 entitled "Element Aligning Mechanism of a Transporting Device" discloses an aligning mechanism capable of pushing a tray. Specifically, the aligning mechanism of the prior art includes a pushing block and a pneumatic cylinder, and the pushing block has a bevel. When the pneumatic cylinder drives the pushing block to push the tray, component forces in two directions can be generated with the bevel to move the tray in the two directions into position. However, the design of this pushing block drawbacks that the pushing forces in the two directions are uneven and controlling the pushing forces is difficult and that in the case of the smaller pushing forces the tray may not be able to be pushed into position and in the case of the larger pushing forces, the tray may be overturned. The contact point of the bevel with the tray varies with the position of the tray and directly affect the magnitudes of the pushing forces in the two directions generated by the pushing block.

In addition, when the tested electronic devices are placed into the chip tray on the discharging device in the prior art, the electronic devices are often not completely placed into the chip slots of the chip tray. Even if the electronic devices are placed into the chip slots, in the process of conveying the chip tray by means of the discharging device, due to factors such as the impulse of movement or the impact of the chip tray against the frame, the electronic devices often jump out of the chip slots, resulting in errors in the subsequent transfer or pick-and-place process.

As can be seen from the above, a chip tray positioning device that can accurately position the chip tray and ensure that the electronic devices can be completely placed into the chip slots is highly expected in the industry and the public.

SUMMARY OF THE INVENTION

The main object of the present invention is to provide a chip tray positioning device, which can ensure that the electronic devices completely get into the chip slots of the chip tray and are stably placed therein. Furthermore, another object of the present invention is to realize the positioning of the chip tray and eliminate an error formed in the transfer process of the chip tray.

To achieve the above objects, the present invention provides a chip tray positioning device, which comprises a frame body, a tray conveying module, a pushing module and a controller. The frame body includes a start area and an end area, and the end area includes an end wall, a first lateral wall and a second lateral wall; the tray conveying module is disposed on the frame body for conveying a chip tray from the start area to the end area; the pushing module is disposed on the first lateral wall of the frame body; the controller is electrically connected to the tray conveying module and the pushing module, wherein after the chip tray is transferred to the end area, the controller controls the pushing module to knock the chip tray at a specific frequency.

Specifically, after electronic devices in the chip tray have been transferred, a small number of electronic devices may be inevitably incompletely placed in chip slots due to transfer or pick-and-place errors or fall off from the chip slots due to the movement of the chip tray. However, in the present invention, the pushing module knocks the chip tray at the specific frequency so that the chip tray is vibrated to facilitate the electronic devices to completely get into the chip slots of the chip tray and to be stably placed therein.

Preferably, the present invention may further comprise a first tray detecting module, a second tray detecting module, a third tray detecting module and a fourth tray detecting module. The first tray detecting module is disposed, on at least one of the first lateral wall and the second lateral wall of the frame body, adjacent to the end wall for detecting whether the chip tray is located in the end area; the second tray detecting module is disposed, on at least one of the first lateral wall and the second lateral wall of the frame body, away from the end wall for detecting whether the chip tray is positioned in place or is being conveyed; the third tray detecting module and the fourth tray detecting module are disposed on at least one of the first lateral wall and the second lateral wall of the frame body between the first tray detecting module and the second tray detecting module, and the height position detected by the third tray detecting module is different form the height position detected by the fourth tray detecting module so the third tray detecting module and the fourth tray detecting module can be adapted to detect chip trays with different heights and to detect whether the chip tray is laid horizontally.

To achieve the above objects, the present invention provides a chip tray positioning device, which comprises a frame body, a tray conveying module, a pulling module, a pushing module and a controller. The frame body includes a start area and an end area, and the end area includes an end wall, a first lateral wall and a second lateral wall; the tray conveying module is disposed on the frame body for conveying a chip tray from the start area to the end area in a first direction; the pulling module is disposed on the frame body and located in the end area for making the chip tray abut against the end wall of the frame body; the pushing module is disposed on the first lateral wall of the frame body and located in the end area for pushing the chip tray in a second direction so that the chip tray is abutted against the second lateral wall of the frame body; the controller is electrically connected to the tray conveying module, the pulling module and the pushing module, wherein after the chip tray are abutted against the end wall and the second lateral wall of the frame body, the controller controls the pushing module to knock the chip tray at a specific frequency.

In other words, in the present invention, the chip tray is abutted against the end wall and the second lateral wall of the frame body by means of the pulling module and the pushing module, thereby realizing the positioning of the chip tray and eliminating an error generated in the transfer process of the chip tray. In addition, the chip tray is knocked at the specific frequency by the pushing module so that the chip tray is vibrated to facilitate electronic devices to completely get into the chip slots of the chip tray and to be stably placed therein.

DESCRIPTION OF THE PREFERRED EMBODIMENTS

Figure 1:
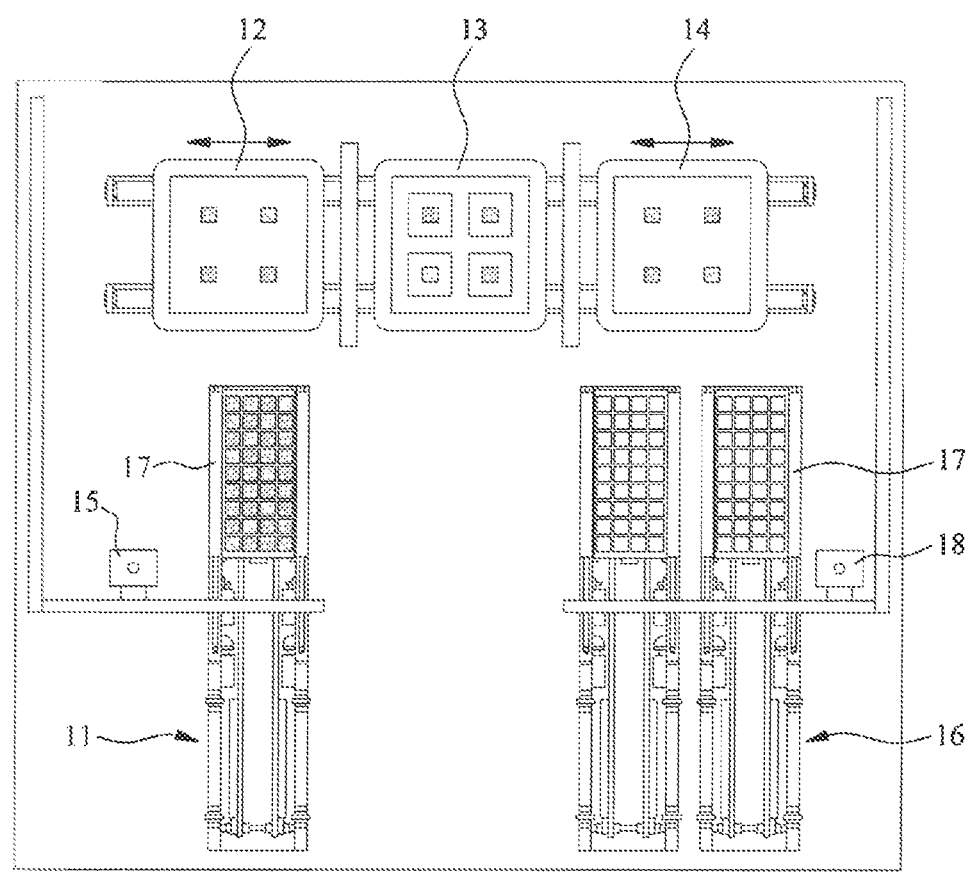
FIG. 1 is a plan view illustrating a module layout of a conventional electronic device testing apparatus.

Before a chip tray positioning device according to the present invention is described in detail in embodiments, it should be noted that in the following description, similar components will be designated by the same reference numerals. Furthermore, the drawings of the present invention are for illustrative purposes only, they are not necessarily drawn to scale, and not all details are necessarily shown in the drawings.

Figure 2:
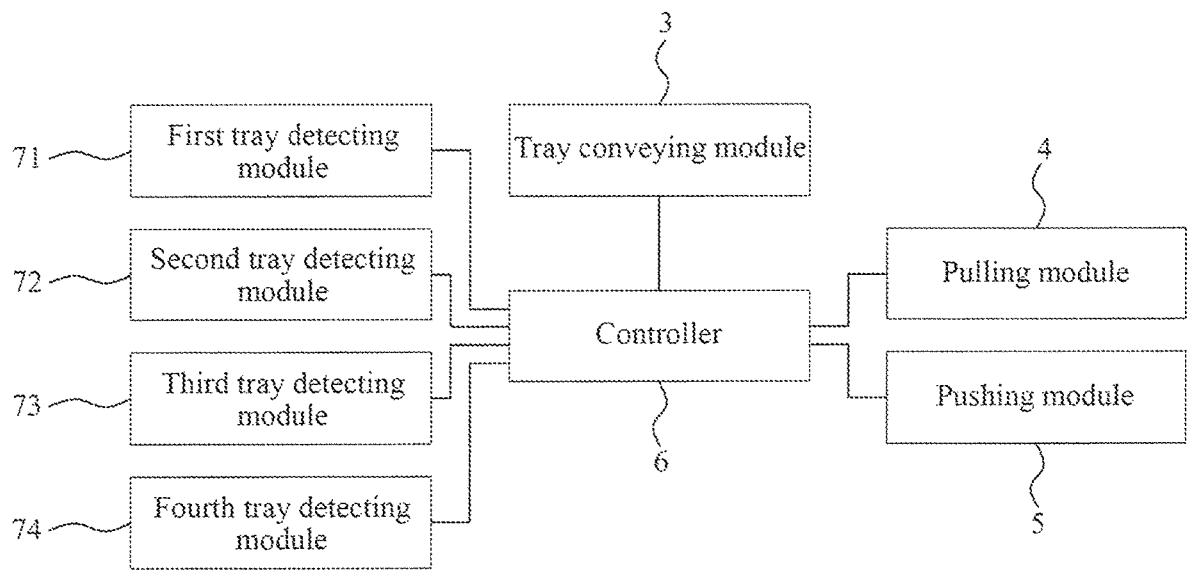
FIG. 2 is a system architecture diagram of a preferred embodiment of the present invention.
Figure 3:
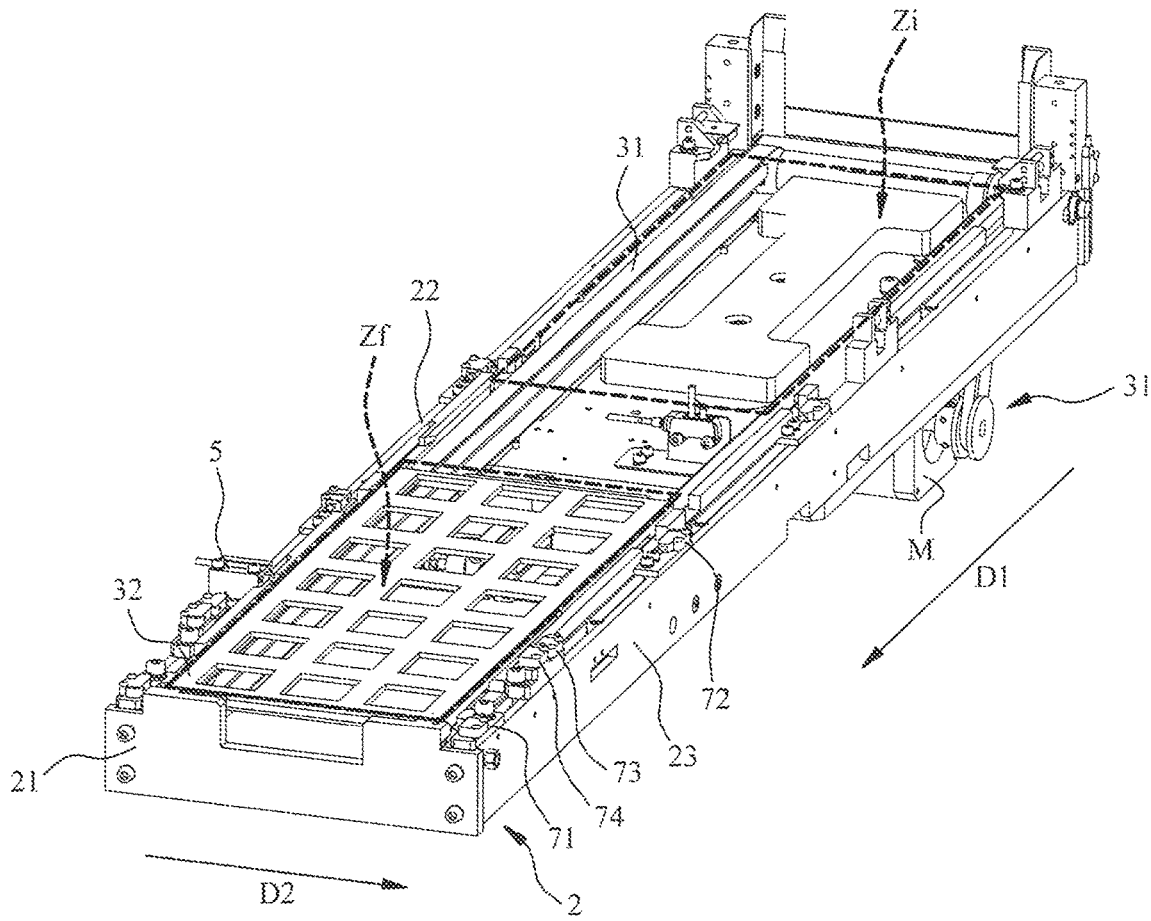
FIG. 3 is a perspective views of a preferred embodiment of the present invention.
Figure 4:
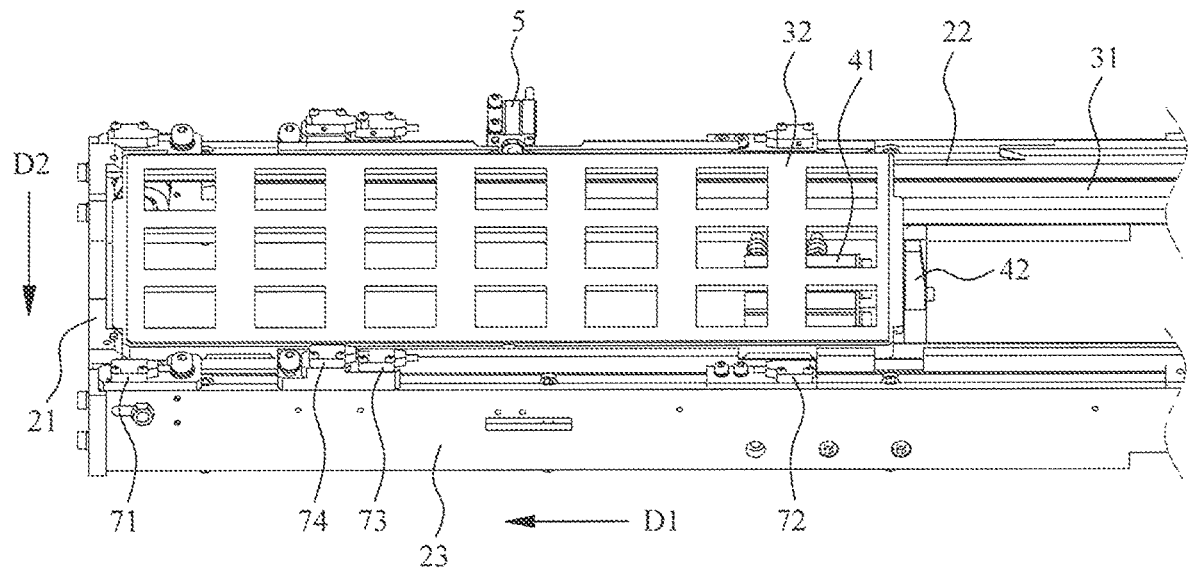
FIG. 4 is another partial perspective view of a preferred embodiment of the present invention.
Figure 5:
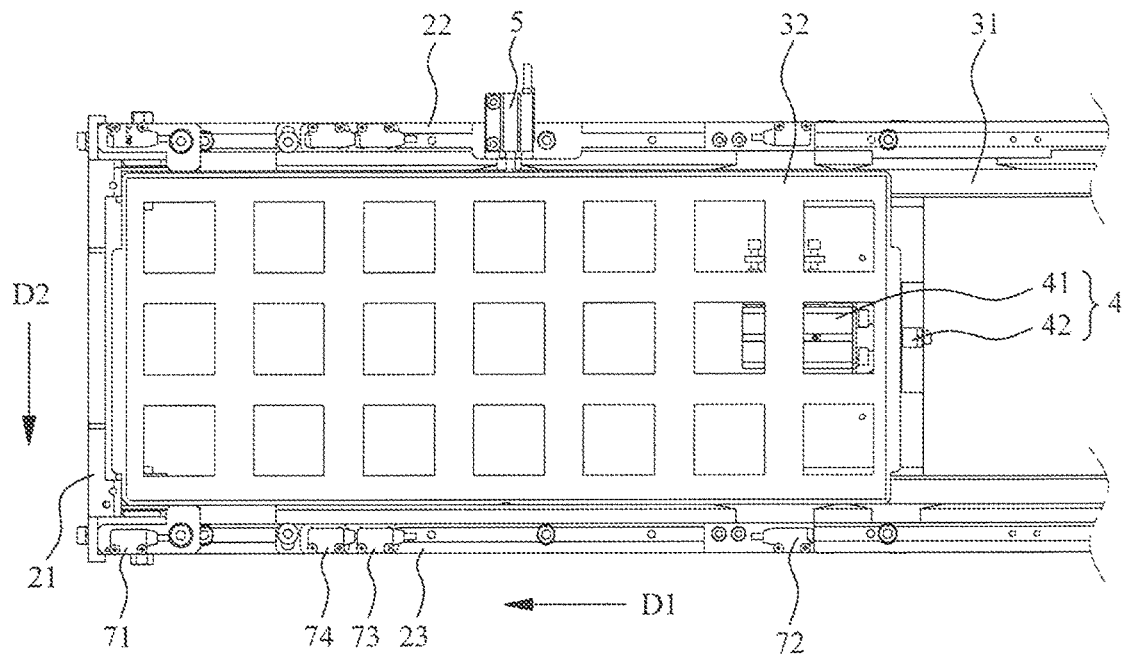
FIG. 5 is a partial top view of a preferred embodiment of the present invention.

Reference is made to FIG. 2, FIG. 3, FIG. 4 and FIG. 5. FIG. 2 is a system architecture diagram of a preferred embodiment of the present invention; FIG. 3 is a perspective view of a preferred embodiment of the present invention; FIG. 4 is another partial perspective view of a preferred embodiment of the present invention; and FIG. 5 is a partial top view of a preferred embodiment of the present invention.

As shown in these figures, the present embodiment mainly includes a frame body 2, a tray conveying module 3, a pulling module 4, a pushing module 5, a controller 6, a first tray detecting module 71, a second tray detecting module 72, a third tray detecting module 73 and a fourth tray detecting module 74. The controller 6 is adapted to control the actions of the tray conveying module 3, the pulling module 4 and the pushing module 5 and to receive the detection results of the first tray detecting module 71, the second tray detecting module 72, the third tray detecting module 73 and the fourth tray detecting module 74.

The frame body 2 of the present embodiment is a rectangular frame body and includes a start area Zi and an end area Zf on both sides in the longitudinal direction respectively. The end area Zf includes an end wall 21, a first lateral wall 22 and a second lateral wall 23. The tray conveying module 3 of the present embodiment includes a conveyor belt unit 31 and a tray carrying platform 32. The conveyor belt unit 31 is disposed on both sides of the frame body 2 in the longitudinal direction and driven by a motor M which is electrically connected to the controller 6.

The tray carrying platform 32 carried on the conveyor belt unit 31 is used for carrying a chip tray. The controller 6 can control the motor M to drive the conveyor belt unit 31, thereby moving the tray carrying platform 32 between the start area Zi and the end area Zf reciprocatingly. For example, after the chip tray with tested electronic devices is moved from the start area Zi to the end area Zf, the chip tray is taken away; and then the tray carrying platform 32 is moved from the end area Zf to the start area Zi in order to carry a next chip tray.

The pulling module 4 is disposed below the frame body 2 and is located in the end zone Zf. The pulling module 4 of the present embodiment includes an actuator 41 and a pawl 42. The actuator 41 is a pneumatic cylinder and adapted to drive the pawl 42 under control of the controller 6 to pull the chip tray in a first direction D1 so that the chip tray is abutted against the end wall 21 of the frame body 2. It should be noted that during the movement of the tray carrying platform 32, the pawl 42 is laid horizontally so that the pull pawl 42 does not obstruct the tray carrying platform 32. When the tray carrying platform 32 reaches the end area Zf, the pawl 42 is swung by the actuator 41 by 90 degrees so as to pull the chip tray.

On the other hand, the pushing module 5 of the present embodiment is disposed on the first lateral wall 22 of the frame body 2 and located in the end zone Zf. The pushing module 5 is formed of a pneumatic cylinder. When the chip tray is located in the end zone Zf, the controller 6 drives the pushing module 5 to push the chip tray in a second direction D2 so that the chip tray is abutted against the second lateral wall 23 of the frame body 2.

That is to say, the controller 6 drives the pulling module 4 to pull the chip tray so that the chip tray is abutted against the end wall 21 of the frame body 2, and then, the controller 6 controls the pushing module 5 to push the chip tray so that the chip tray as abutted against the second lateral wall 23 of the frame body 2. Therefore, one corner of the chip tray is fitted to one corner of the frame body 2, thereby eliminating the error generated during the transfer process of the chip tray and realizing the positioning of the chip tray.

After the positioning of the chip tray is completed, the controller 6 controls the pushing module 5 to knock the chip tray 2 at a specific frequency so that the chip tray is vibrated to facilitate electronic devices which have not been properly positioned in chip slots of the chip tray to completely get into the chip slots and to be stably placed therein.

The first tray detecting module 71, the second tray detecting module 72, the third tray detecting module 73 and the fourth tray detecting module 74 are disposed in the end zone Zf. The first tray detecting module 71 is a photo interrupter switch, which includes a transmitter and a receiver electrically connected to the controller 6. The transmitter and the receiver are disposed on the first lateral wall 22 and the second lateral wall 23 of the frame body 2 respectively and adjacent to the end wall 21. The first tray detecting module 71 is mainly used to detect whether the chip tray has reached the end zone Zf or is located in the end zone Zf, especially, at the end position.

The second tray detecting module 72 is also a photo interrupter switch including a transmitter and a receiver disposed on the first lateral wall 22 and the second lateral wall 23 of the frame body 2 respectively away from the end wall 21, i.e., at a position close to the start area Zi. The second tray detecting module 72 is mainly used to detect whether the chip tray enters the end zone Zf and can also detect whether the chip tray is positioned in place or is being conveyed.

Each of the third tray detecting module 73 and the fourth tray detecting module 74 is a photo interrupter switch which includes a transmitter and a receiver disposed on the first lateral wall 22 and the second lateral wall 23 of the frame body 2 respectively and interposed between the first tray detecting module 71 and the second tray detecting module 72.

It can be clearly seen from the perspective views of FIG. 3 and FIG. 4 that the third tray detecting module 73 and the fourth tray detecting module 74 are disposed at different heights, and the fourth tray detecting module 74 is slightly higher the third tray detecting module 73, that is, the height positions detected by the third tray detecting module 73 and the fourth tray detecting module 74 are different.

In this embodiment, the third tray detecting module 73 and the fourth tray detecting module 74 are disposed to have different detected height positions for the purpose that chip trays with different thicknesses can be detected and the fact whether the chip tray is laid horizontally can be detected. Therefore, the situation that one end or one part of the chip tray tilts up can be immediately detected by the third tray detecting module 73 and the fourth tray detecting module 74 at different heights.

In summary, the chip tray positioning device of the present embodiment has at least the following advantages:
(1) the push module is used to knock the chip tray at a specific frequency so that the chip tray is vibrated to facilitate electronic devices which have not been well positioned in chip slots of the chip tray to completely get into the chip slots and to be stably placed therein;
(2) the chip tray can be abutted against the end wall and the second lateral wall of the frame body by the pulling module and the pushing module so that one corner of the chip tray can be fitted to one corner of the frame body, that is, the positioning of the chip tray is completed, thereby eliminating an error generated during the transfer process of the chip tray;
(3) The first tray detecting module is used to detect whether the chip tray has reached the end area or is located in the end area, especially at the end position;
(4) the second tray detecting module is used to detect whether the chip tray enters the end area and to detect whether the chip tray is positioned in place or is being conveyed; and
(5) the third tray detecting module and the fourth tray detecting module are used to detect chip trays with different thicknesses and to detect whether the chip tray is laid horizontally.

The preferred embodiment of the present invention is illustrative only, and the claimed inventions are not limited to the details disclosed in the drawings and the specification. Accordingly, it is intended that it have the full scope permitted by the language of the following claims.

What is claimed is:

1. A chip tray positioning device, comprising:
   a frame body, including a start area and an end area, the end area including an end wall, a first lateral wall and a second lateral wall;
   a tray conveying module, disposed on the frame body for conveying a chip tray from the start area to the end area;
   a pushing module, disposed on the first lateral wall of the frame body; and
   a controller, electrically connected to the tray conveying module and the pushing module,
   wherein after the chip tray is transferred to the end area, the controller controls the pushing module to knock the chip tray at a specific frequency.

2. The chip tray positioning device of claim 1, further comprising a pulling module, which is disposed on the frame body, located in the end area and electrically connected to the controller, wherein when the chip tray is located in the end area, the controller drives the pulling module to pull the chip tray so that the chip tray is abutted against the end wall of the frame body.

3. The chip tray positioning device of claim 2, wherein the pulling module includes an actuator and a pawl, the actuator is adapted to drive the pawl under control of the controller to pull the chip tray so that the chip tray is abutted against the end wall of the frame body.

4. The chip tray positioning device of claim 3, wherein the pushing module and the actuator of the pulling module are each formed by a pneumatic cylinder.

5. The chip tray positioning device of claim 1, wherein when the chip tray is located in the end area, the controller drives the pushing module to push the chip tray towards the second lateral wall so that the chip tray is abutted against the second lateral wall of the frame body.

6. The chip tray positioning device of claim 1, further comprising a first tray detecting module electrically connected to the controller, the first tray detecting module being disposed on at least one of the first lateral wall and the second lateral wall of the frame body and adjacent to the end wall, wherein the controller controls the first tray detecting module to detect whether the chip tray is located in the end area.

7. The chip tray positioning device of claim 6, further comprising a second tray detecting module electrically connected to the controller, the second tray detecting module being disposed on at least one of the first lateral wall and the second lateral wall of the frame body away from the end wall, wherein the controller controls the second tray detecting module to detect whether the chip tray is positioned in place or is being conveyed.

8. The chip tray positioning device of claim 7, further comprising a third tray detecting module and a fourth tray detecting module electrically connected to the controller, the third tray detecting module and the fourth tray detecting module being disposed on at least one of the first lateral wall and the second lateral wall of the frame body between the first tray detecting module and the second tray detecting module, wherein height positions detected by the third tray detecting module and the fourth tray detecting module are different.

9. The chip tray positioning device of claim 1, wherein the tray conveying module includes a conveyor belt unit and a tray carrying platform, the conveyor belt unit is electrically connected to the controller, the tray carrying platform carried on the conveyor belt unit is used to carry the chip tray, the conveyor belt unit is adapted to reciprocatingly move the tray carrying platform between the start area and the end area under control of the controller.

10. A chip tray positioning device, comprising:
a frame body, including a start area and an end area, the end area including an end wall, a first lateral wall and a second lateral wall;
a tray conveying module, disposed on the frame body for conveying a chip tray from the start area to the end area in a first direction;
a pulling module, which is disposed on the frame body and located in the end area and by which the chip tray is abutted against the end wall of the frame body,
a pushing module, disposed on the first lateral wall of the frame body and located in the end area, the pushing module being used for pushing the chip tray in a second direction so that the chip tray is abutted against the second lateral wall of the frame body; and
a controller, electrically connected to the tray conveying module, the pulling module and the pushing module,
wherein after the chip tray is abutted against the end wall and the second lateral wall of the frame body, the controller controls the pushing module to knock the chip tray at a specific frequency.

* * * * *